United States Patent
Ward et al.

(10) Patent No.: US 6,806,170 B2
(45) Date of Patent: Oct. 19, 2004

(54) METHOD FOR FORMING AN INTERFACE FREE LAYER OF SILICON ON A SUBSTRATE OF MONOCRYSTALLINE SILICON

(75) Inventors: Peter Ward, Peterborough (GB); Simona Lorenti, Catania (IT); Giuseppe Ferla, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 91 days.

(21) Appl. No.: 10/242,293

(22) Filed: Sep. 12, 2002

(65) Prior Publication Data

US 2003/0060028 A1 Mar. 27, 2003

(30) Foreign Application Priority Data

Sep. 13, 2001 (EP) .............................. 01830580

(51) Int. Cl.[7] .............................. H01L 21/20
(52) U.S. Cl. ...................... 438/489; 438/509
(58) Field of Search ................. 438/309, 341, 438/478–483, 488, 489, 509, 758, 795, 796, FOR 242, FOR 268; 117/3, 9, 10, 44, 217, 222, 318; 257/E21.09, E21.133, E21.158, E21.461, E21.476, E21.563

(56) References Cited

U.S. PATENT DOCUMENTS

| | | | |
|---|---|---|---|
| 4,812,890 A | | 3/1989 | Feygenson |
| 5,266,504 A | * | 11/1993 | Blouse et al. ............... 438/364 |
| 5,282,088 A | * | 1/1994 | Davidson .................... 359/664 |
| 5,595,926 A | * | 1/1997 | Tseng ......................... 438/243 |
| 5,869,389 A | * | 2/1999 | Ping et al. .................. 438/486 |
| 5,913,125 A | | 6/1999 | Brouillette et al. |
| 6,489,211 B1 | * | 12/2002 | Freeman, Jr. et al. ....... 438/322 |

FOREIGN PATENT DOCUMENTS

| | | |
|---|---|---|
| EP | 0 933 801 | 8/1999 |
| EP | 1 020 899 | 7/2000 |
| JP | 04102333 | 4/1992 |
| JP | 07074181 | 3/1995 |
| JP | 07115099 | 5/1999 |

OTHER PUBLICATIONS

Research Disclosure No. 338070, Jun. 10, 1992, "Poly Silicon or Monocrystal Emitter Bipolar Transistor Production" (Abstract Only).

Christou et al. "Solid Phase Epitaxial Regrowth of Amorphous Silicon on Molecular Beam Epitaxial Silicon/Si Layers", 320 Applied Physics Letters, American Institute of Physics, New York, vol. 42, No. 12, Jun. 1983, pp. 1021–1023, XP000817153.

European Search Report dated Mar. 1, 2002 for Euopean Application No. 01830580.

* cited by examiner

Primary Examiner—George Fourson
Assistant Examiner—Brook Kebede
(74) Attorney, Agent, or Firm—Lisa K. Jorgenson; Stephen Bongini; Fleit, Kain, Gibbons, Gutman, Bongini & Bianco P.L.

(57) ABSTRACT

A method for forming an interface free layer of silicon on a substrate of monocrystalline silicon is provided. According to the method, a substrate of monocrystalline silicon having a surface substantially free of oxide is provided. A silicon layer in-situ doped is deposited on the surface of the substrate in an oxygen-free environment and at a temperature below 700° C. so as to produce a monocrystalline portion of the silicon layer adjacent to the substrate and a polycrystalline portion of the silicon layer spaced apart from the substrate. The silicon layer is heated so as to grow the monocrystalline portion of the silicon layer through a part of the polycrystalline portion of the silicon layer. Also provided is a method for manufacturing a bipolar transistor.

15 Claims, 5 Drawing Sheets

METHOD FOR FORMING AN INTERFACE FREE LAYER OF SILICON ON A SUBSTRATE OF MONOCRYSTALLINE SILICON

CROSS-REFERENCE TO RELATED APPLICATIONS

This application is based upon and claims priority from European Patent Application No. 01830580.5, filed Sep. 13, 2001, the entire disclosure of which is herein incorporated by reference.

BACKGROUND OF THE INVENTION

1. Field of the Invention

The present invention relates to the field of integrated circuit fabrication, and more specifically to a method for forming an interface free layer of silicon on a substrate of monocrystalline silicon.

2. Description of Related Art

Integrated circuit production often requires the flexibility of adding a semiconducting or insulating layer on top of a partially formed circuit. Particularly, a layer of silicon deposited on a substrate of monocrystalline silicon (or monosilicon) is typically used as a source of dopant (or impurities) for the substrate and/or as a contact for connecting an underlying region of the substrate with the external environment.

A solution known to one of ordinary skill in the art and extensively employed in several applications includes forming a layer of polycrystalline silicon (or polysilicon) on the monosilicon substrate. The polysilicon layer is obtained with a Chemical Vapor Deposition (CVD) process, which is carried out at a low temperature (about 600–700° C.).

For example, the CVD process is employed for manufacturing bipolar transistors for high speed switching and high frequency analog applications. The most commonly used bipolar transistors have vertically aligned emitter, base and collector regions. The bipolar transistors show a shallow architecture, with a very thin base region that speeds up their switching. In this type of device, such as the devices produced using Double Polysilicon Self Aligned (DPSA) technology, the collector and base regions are formed in a monosilicon substrate. The emitter region consists of a polysilicon layer that is deposited over the base region. The use of a low temperature for the deposition of the polysilicon layer reduces any undesired dopant diffusion from the base region, thereby avoiding an increase in its width. This aspect in particular is extremely important in the manufacturing of Heterojunction Bipolar Transistors (HBTs), wherein germanium is added to the (silicon) base region to improve the speed of the devices. In this case, any prolonged heating of the devices at high temperature must be avoided in order to prevent the formation of lattice defects (attributed to the difference in lattice constants between silicon and germanium) and to prevent dopants from diffusing from their desired position.

The polysilicon emitter described above, however, has a major drawback, especially for advanced ultra-shallow devices. The polysilicon emitter causes an increased recombination of minority charges during operation of the transistor. This phenomenon reduces the gain of the transistor and increases its noise.

Several techniques have been proposed for controlling an interface between the monosilicon substrate and the emitter region, from both a material and an electrical standpoint. One known solution involves creating interstitial defects on a surface of the monosilicon substrate. A layer of silicon is then deposited on the substrate at low temperature. The layer has a monocrystalline structure on its lower side, with crystallographic axes different from the axes of the substrate, and a polycrystalline or amorphous structure on its upper side.

Another solution involves of depositing a thin layer of amorphous silicon in-situ doped on the substrate. A capping layer of polysilicon is then deposited on the layer of amorphous silicon. The two layers are then subjected to a prolonged heating (of several hours, for example) at low temperature, in order to re-crystallize the layer of amorphous silicon into a single crystal by Solid Phase Epitaxy (SPE).

None of the known solutions, however, are completely satisfactory. For example, the interface between the monosilicon substrate and the emitter region causes dopant segregation from the substrate to the interface, and then into the emitter region. Moreover, the interface increases the electrical resistance of the emitter region, which limits the maximum current rating of the transistor. This results in degradation of transistor characteristics and yield.

SUMMARY OF THE INVENTION

In view of these drawbacks, it is an object of the present invention to overcome the above-mentioned drawbacks and to provide a method of forming an interface free layer of silicon on a substrate of monocrystalline silicon.

One embodiment of the present invention provides a method for forming an interface free layer of silicon on a substrate of monocrystalline silicon. According to the method, a substrate of monocrystalline silicon having a surface substantially free of oxide is provided and a silicon layer in-situ doped is deposited on the surface of the substrate in an oxygen-free environment and at a temperature below 700° C. so as to produce a monocrystalline portion of the silicon layer adjacent to the substrate and a polycrystalline portion of the silicon layer spaced apart from the substrate. The silicon layer is heated so as to grow the monocrystalline portion of the silicon layer through a part of the polycrystalline portion of the silicon layer.

Another embodiment of the present invention provides a method for manufacturing a bipolar transistor. According to the method, a substrate of monocrystalline silicon having a surface substantially free of oxide is provided. The substrate includes a collector region of a first conductivity type and a base region of a second conductivity type. A silicon layer in-situ doped with the first conductivity type is deposited on the surface of the substrate in an oxygen-free environment and at a temperature below 700° C. so as to produce a monocrystalline portion of the silicon layer adjacent to the substrate and a polycrystalline portion of the silicon layer spaced apart from the substrate. The silicon layer is heated so as to grow the monocrystalline portion of the silicon layer through part of the polycrystalline portion of the silicon layer, the monocrystalline portion of the silicon layer defining an emitter region and the polycrystalline portion defining a contact region for the emitter region.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1A:
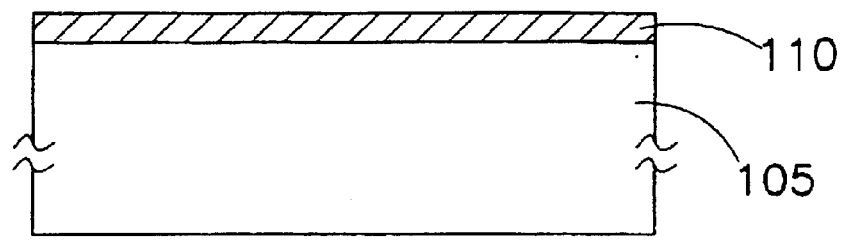
FIG. 1a to FIG. 1c show the stages of a method for forming an interface free layer of silicon on a substrate of monocrystalline silicon in accordance with a preferred embodiment of the present invention.
Figure 1B:
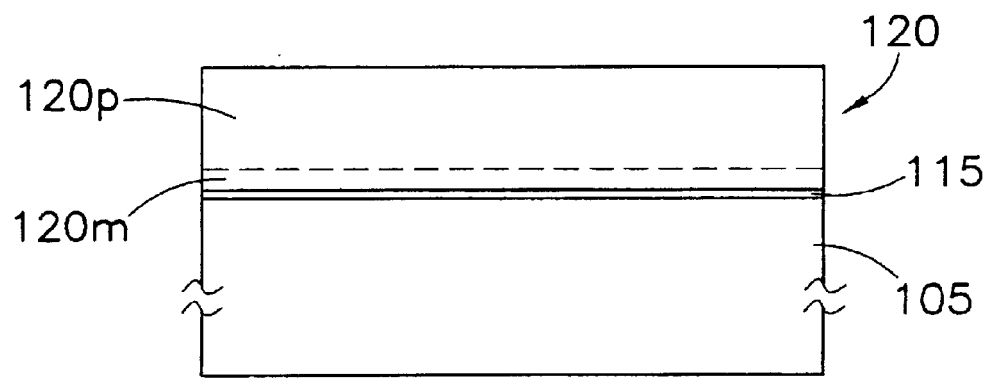
Figure 1C:
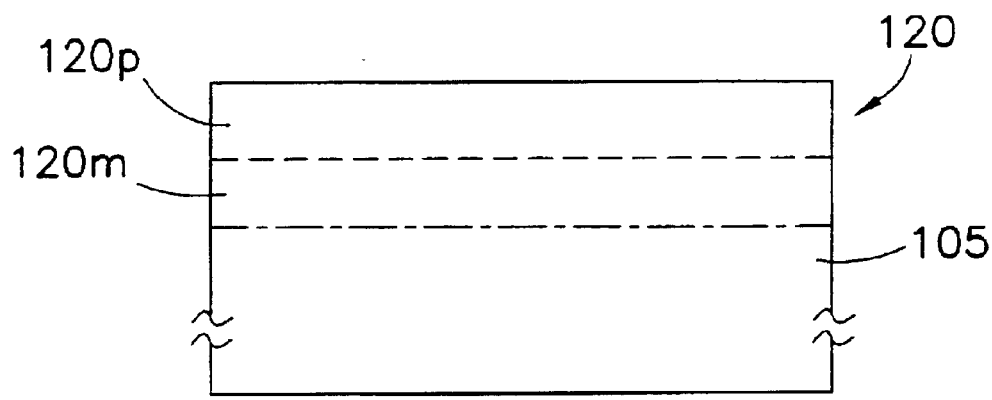

FIG. 1a to FIG. 1c show a method for forming an interface free layer of silicon on a monocrystalline silicon substrate in accordance with a preferred embodiment of the present invention. With reference in particular to FIG. 1a, the method starts with a monosilicon substrate 105. An upper surface of the monosilicon substrate 105 is typically covered with a layer of silicon dioxide 110. The monosilicon substrate 105 is prepared to have a minimum of oxide on its upper surface. Particularly, a cleaning process is used to remove the oxide layer 110. In one embodiment, the cleaning process is carried out by immersion in a dilute solution of hydrofluoric acid, followed by rinsing and drying of the monosilicon substrate 105.

At the end of the cleaning process, the upper surface of the monosilicon substrate 105 is essentially free of oxide. However, a native oxide layer 115 (FIG. 1b) is quickly formed on the upper surface of the monosilicon substrate 105 even in air at ambient temperature. The amount of oxide present on the upper surface of the monosilicon substrate 105 at the beginning of the next process step must be kept at a negligible value. The thickness of the oxide layer 115 should be lower than 2 nm, and preferably lower than 1 nm. For example, the substrate should not be kept in air at ambient temperature for a period longer than 30 minutes.

A silicon layer 120 is deposited on the monosilicon substrate 105 (having the oxide layer 115) using a low temperature CVD process. In the preferred embodiment, the CVD process is carried out at a temperature below 700° C., and preferably between 600° C. and 650° C. (630° C., for example). The layer of silicon 120 is in-situ doped. That is, in the preferred embodiment, dopant-containing gases, such as arsine ($AsH_3$), are introduced into a CVD reactor along with the silicon-containing gas. The silicon layer 120 is deposited in an oxygen-free environment, so that the monosilicon substrate 105 is only exposed to a vacuum or process gases.

As a consequence, no further oxidation of the upper surface of the monosilicon substrate 105 is possible during the CVD process. The result of this procedure is that of forming a silicon layer having a thin portion 120*m* with a monocrystalline structure in its lower side adjacent to the upper surface of the monosilicon substrate 105. The monosilicon portion 120*m* has the same crystallographic axis as the monosilicon substrate 105. In addition, a remaining portion 120*p* of the silicon layer 120 (extending for most of its thickness and being spaced apart from the monosilicon substrate 105) has a polycrystalline structure. For example, in one embodiment, the silicon layer 120 has a thickness of 200 nm, and the monosilicon portion 120*m* has a thickness of 50 nm. It should be noted that this composite structure is obtained using a single deposition step of the silicon layer 120.

The structure is then subjected to a very brief heat treatment at moderate temperature. In the preferred embodiment, the heat treatment is carried out at a temperature between 800° C. and 1100° C. for a period ranging from 10 s to 30 s, and preferably at 1000° C. for 20 s. A suggested choice for this heat treatment is the Rapid Thermal Anneal (RTA) technique, which uses a flash lamp to heat the structure quickly. As shown in FIG. 1c, during the heat treatment described above, the monosilicon portion 120*m* acts as a seed layer that grows through most of the polysilicon portion 120*p*, thereby producing a thick region with a monocrystalline structure. For example, in the embodiment described above, the monosilicon portion 120*m* reaches a thickness of 100 nm (out of an entire thickness of 200 nm of the silicon layer 120).

Furthermore, any oxygen in the oxide layer 115 located at the interface between the monosilicon substrate 105 and the silicon layer 120 is dissolved in such a way that the oxide layer 115 disappears and the position of this interface is no longer discernable. Therefore, the monosilicon portion 120*m* is continuous with and indistinguishable from the monosilicon substrate 105. Neither material nor crystallographic interface is detectable in the structure. At the same time, some of the impurities in the silicon layer 120 are segregated to the polysilicon portion 120*p*, due to their redistribution between the polysilicon portion 120*p* and the growing monosilicon portion 120*m*. As a consequence, the polysilicon portion 120*p* features a very low resistance, because of its high dopant concentration.

The embodiment described above is meant to be illustrative of the general method of the present invention. Similar considerations apply if the layer of silicon is in-situ doped with impurities of a different type, if it is deposited with an analogous procedure, if the silicon layer and the monosilicon portion thereof (either before or after its growing) have a different thickness, and so on.

With reference now to FIG. 2a to FIG. 2d (the elements common to the different figures are identified by the same numerals), a bipolar transistor 200 integrated in a chip of semiconductor material with a BICMOS technology is illustrated in cross-section at different points of processing. Typically, the same integrated structure is formed in large numbers in several identical areas of a wafer of semiconductor material, which are subsequently separated by a cutting operation. As usual, the concentrations of N-type and P-type impurities are denoted by adding the sign + or the sign − to the letters N and P to indicate a high or low concentration of impurities, respectively. Also, the sign ++ or the sign −− is used to indicate a very high or a very low concentration of impurities, respectively. The letters N and P without the addition of any sign + or − denote concentrations of intermediate value.

Figure 2A:
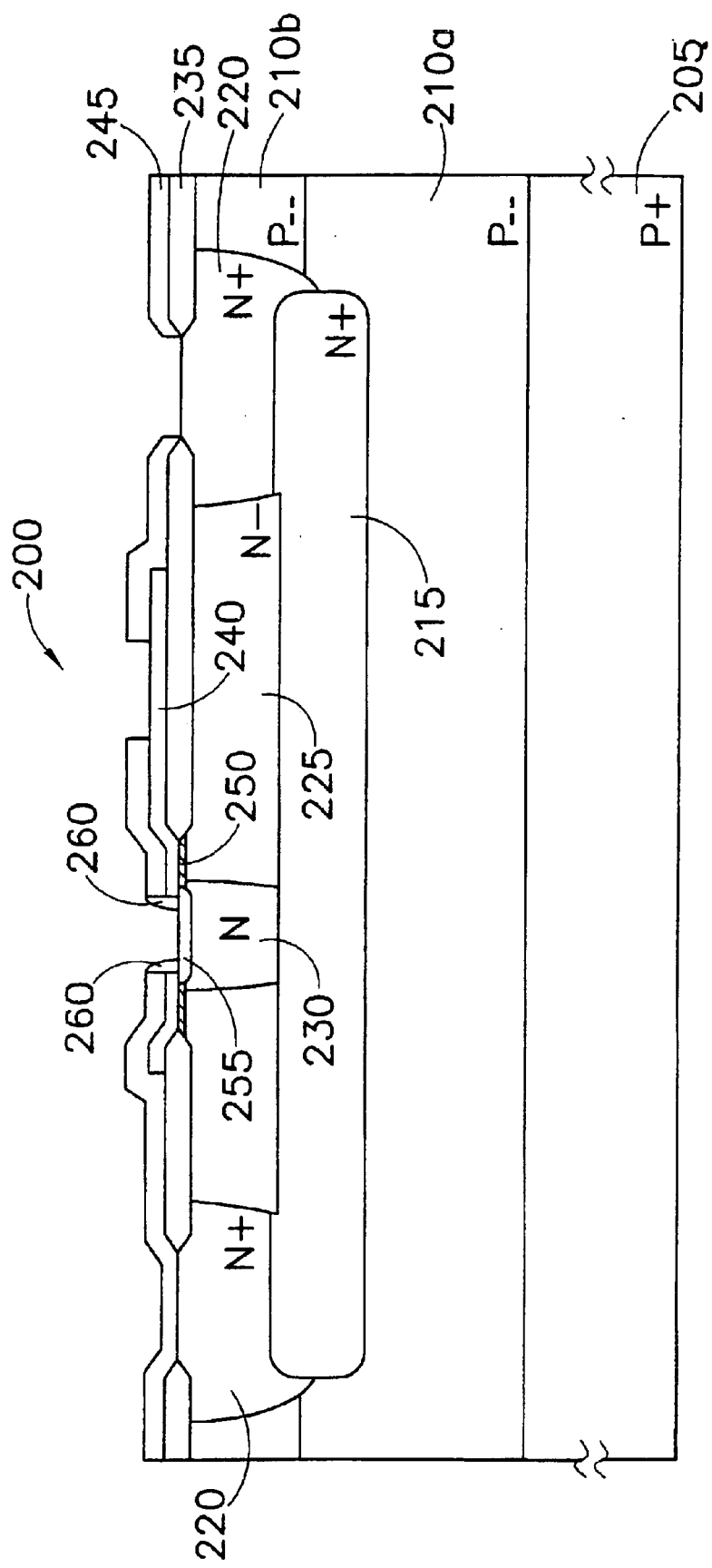
FIG. 2a to FIG. 2d are cross-sectional views of a bipolar transistor according to one embodiment of the present invention.

Considering FIG. 2a, the transistor 200 is integrated on a monosilicon substrate 205, which is strongly doped with P-type impurities (P+), and two P−− epitaxial layers 210*a* and 210*b* are grown on the substrate 205. A region 215 having a high concentration of N-type impurities (N+) is buried between the epitaxial layers 210*a* and 210*b*. An N+ contact region 220 reaches the buried region 215 and delimits an N− region 225. An N-type region 230 extends through the whole region 225 as far as to reach the buried region 215.

An upper surface of the epitaxial layer 210*b* is covered with a thick layer of silicon dioxide 235. Windows are opened in the oxide layer 235 around the region 230 (leaving a portion of the region 225 exposed) and over the contact region 220. A layer of polysilicon 240 in-situ doped with P-type impurities is deposited on the oxide layer 235 and has a portion in contact with the region 225. A layer 245 of silicon dioxide covers the whole structure, leaving exposed a portion of the contact region 220 and the region 230. A P– region 250 is formed by diffusion of the impurities in the polysilicon layer 240. Germanium and impurities of the P-type are implanted through the window over the region 230, in order to form a P– region 255. A sidewall spacer 260 is then formed around this window.

The process steps for obtaining the structure shown in the figure are known in the art, so their explanation is omitted for the sake of simplicity.

Figure 2B:
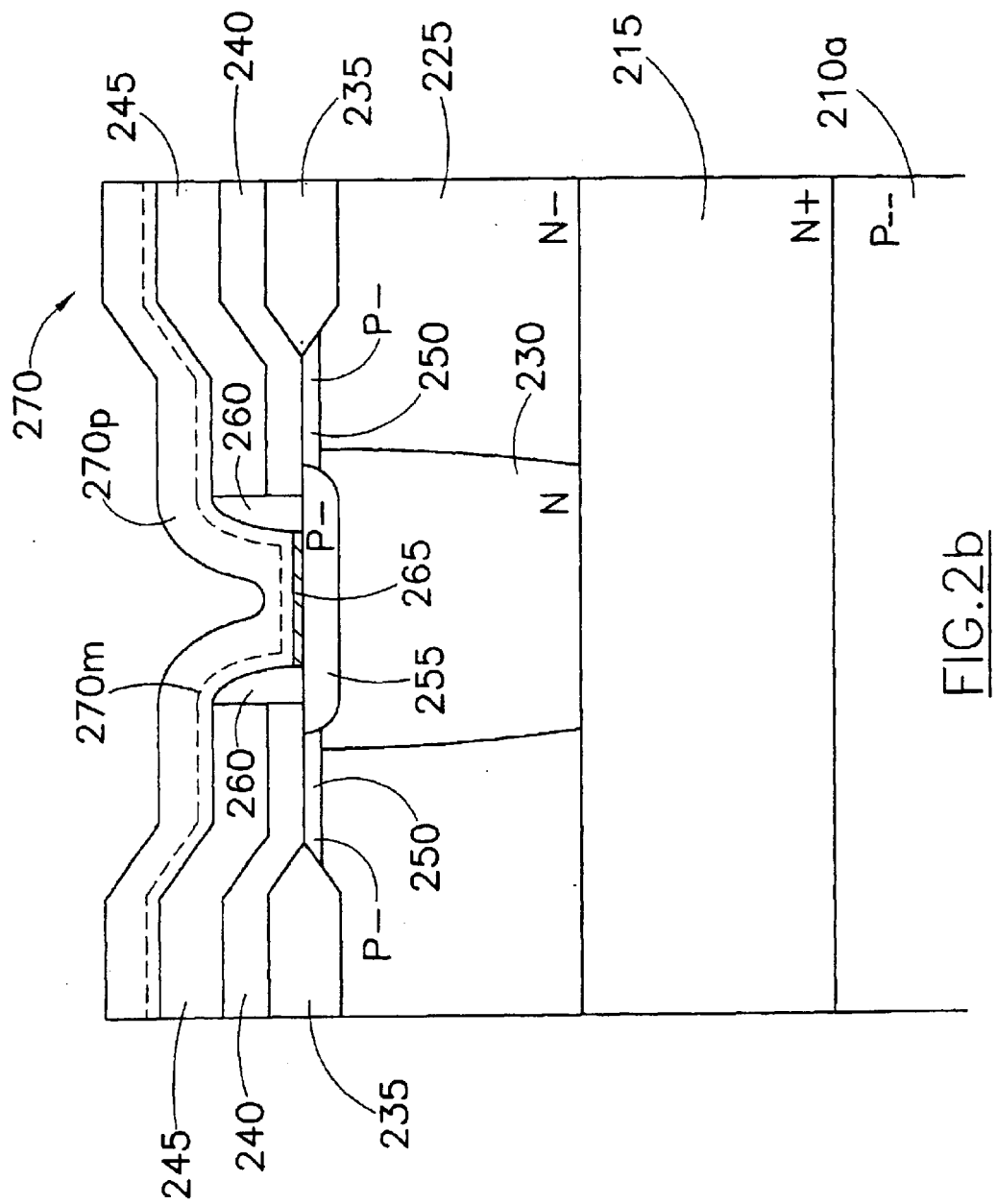

An interface free layer of silicon is then formed on the monosilicon substrate so obtained, by using the process described above. With reference to the view of FIG. 2b showing an enlarged detail of the structure, the wafer is cleaned in order to have a minimum layer of native oxide 265 on its upper surface (over the region 255). A layer 270 of silicon in situ-doped with N-type impurities (such as arsenic) is deposited on the wafer, using a CVD process in an oxygen-free environment and at low temperature. The silicon layer 270 consists of a thin monosilicon portion 270m and a remaining polysilicon portion 270p.

Figure 2C:
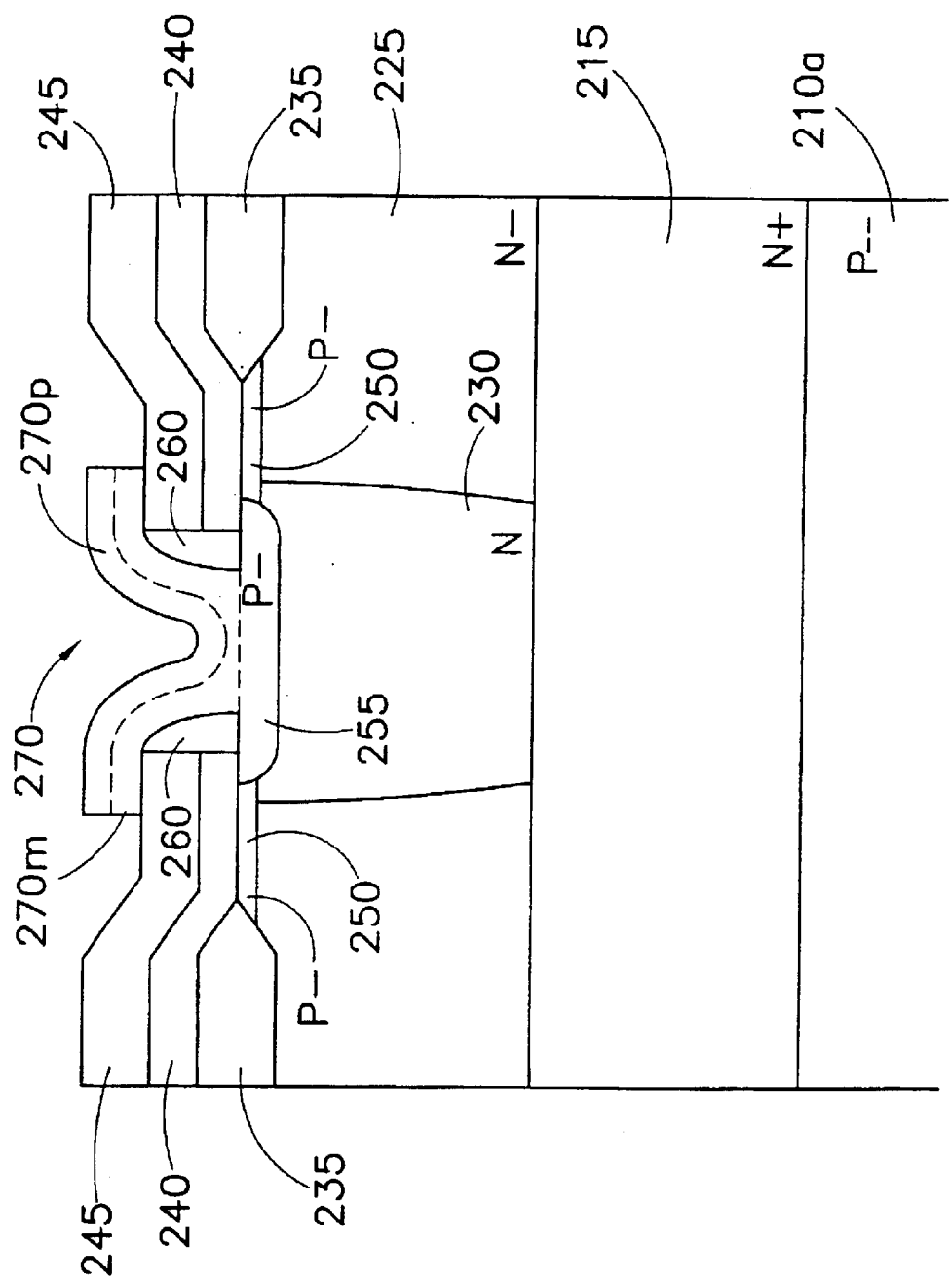

As shown in FIG. 2c, the silicon layer 270 is selectively removed by use of photoresist masking and etching techniques. This results in an island of silicon 270 that is arranged over and in contact with a central portion of the region 255. The wafer is then subjected to an RTA treatment, during which the oxide layer 265 (FIG. 2b) dissolves and the monosilicon portion 270m grows through most of the polysilicon portion 270p (with a corresponding dopant segregation). In this way, the structure presents a monosilicon region 270m that is continuous with the region 255 of the monosilicon substrate, and a polysilicon region 270p with a very high-concentration of N-type impurities.

Figure 2D:
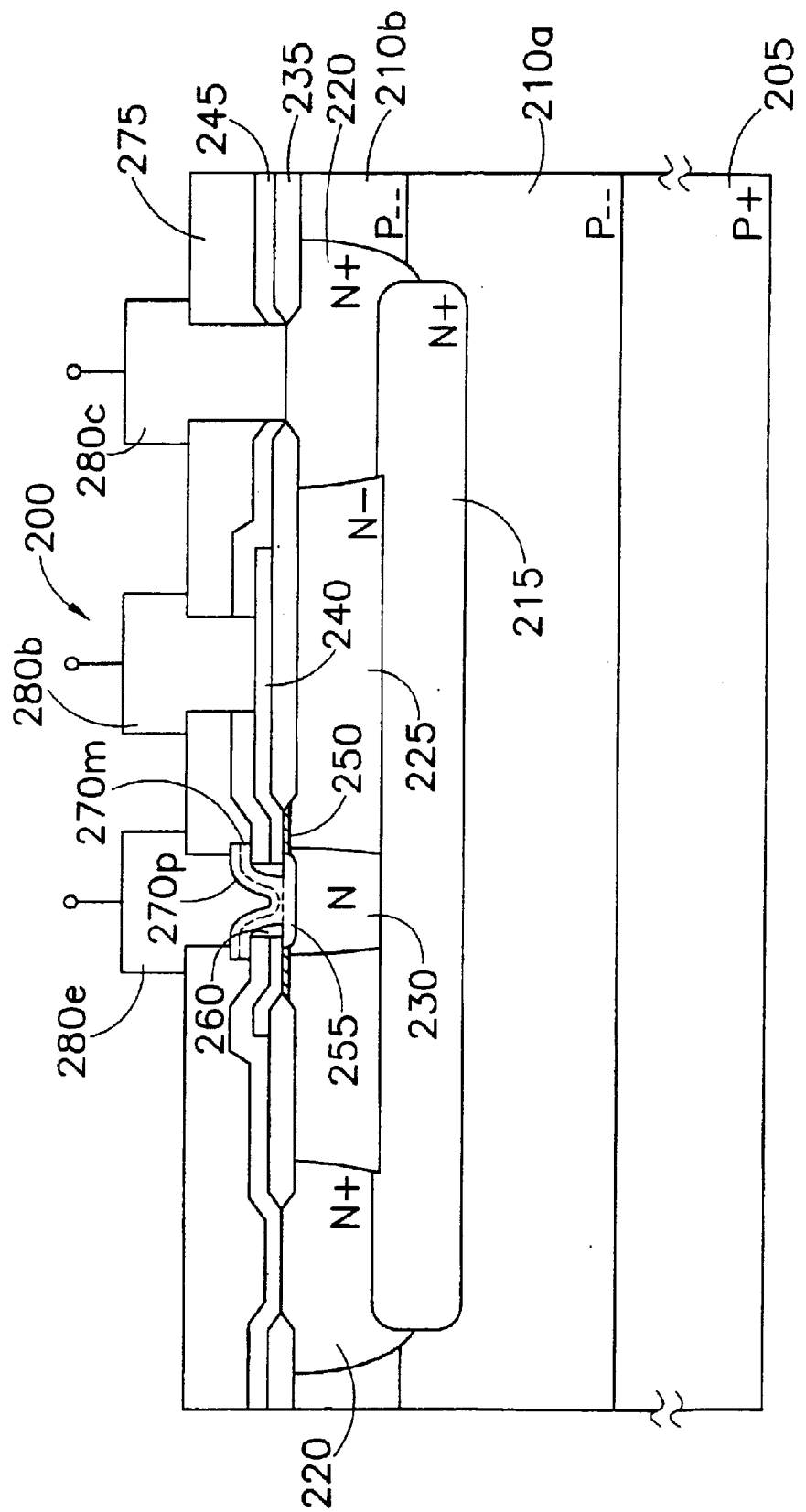

Returning to an overall view of the structure as shown in FIG. 2d, the wafer is covered with a thick layer of silicon dioxide 275, which is deposited through a plasma process in the preferred embodiment. The oxide layer 275 is made planar through a Chemical Mechanical Polishing (CMP) process. Electrical conducting contacts are then formed by use of photoresist masking, ion etching, and metal deposition techniques. Particularly, a metal track 280e contacts the polysilicon region 270p, a metal track 280b contacts the polysilicon layer 240, and a metal track 280c contacts the exposed portion of the connection region 220.

The integrated structure described above defines a general purpose bipolar NPN transistor with a heterojunction structure. The region 230 is a selective collector and the region 215 is a buried collector that drives a collector current through a low-resistance path to reduce a saturation voltage of the transistor. The contact region 220 connects the regions 230 and 215 to the metallic track 280c, which forms a collector terminal of the transistor. The (germanium-silicon) region 255 is an intrinsic base, which is actually active during operation of the transistor. The transistor has a shallow architecture with a very thin intrinsic base. The region 250 is an extrinsic base connecting (together with the polysilicon layer 240) the intrinsic base 255 through a low-resistance path to the metallic track 280b, which forms a base terminal of the transistor. The monosilicon region 270m defines an emitter of the transistor, which forms a base-emitter junction with the intrinsic base 255. The polysilicon region 270p connects the emitter 270m to the metal track 280e, which forms an emitter terminal.

The embodiment described above is meant to be illustrative. Similar considerations apply if the process includes different steps, if the transistor has a different structure, if the regions of the N-type are replaced by regions of the P-type and vice-versa, if the transistor is manufactured using a different technology, and so on. The same concepts are also applicable to heterojunction bipolar transistors made using epitaxial deposition for, among others, the base region.

More generally, the present invention provides a method for forming an interface free layer of silicon on a substrate of monocrystalline silicon. One preferred method starts with a substrate of monocrystalline silicon having a surface substantially free of oxide. A layer of silicon in-situ doped is deposited on the surface of the substrate in an oxygen-free environment and at a temperature below 700° C. This step provides a first monocrystalline portion of the silicon layer adjacent to the substrate and a second polycrystalline portion of the silicon layer spaced apart from the substrate. The layer of silicon is then heated, in order to grow the monocrystalline portion through part of the polycrystalline portion.

This method provides high reproducibility and manufacturability, since the interface is eliminated obviating the need to provide a critical controlled layer of oxide at the interface between the monosilicon substrate and the polysilicon layer. Moreover, the electrical characteristics are better compared to conventional polysilicon layers with lower resistance and a reduction of carrier recombination in the resulting integrated structure to the absolute minimum.

The use of in-situ doping for the silicon layer minimizes dopant diffusion into the substrate. Furthermore, the present invention substantially eliminates dopant segregation from the substrate, thereby enhancing the control of the manufacturing process and of the resulting integrated structure. The polysilicon portion of the layer so obtained, which is highly defective and heavily doped, is optimal for forming very low resistance metal-semiconductor contacts with the integrated structure.

The preferred embodiment of the invention described above offers further advantages. Particularly, the surface oxide on the substrate before deposition of the silicon layer preferably has a thickness lower than 1 nm. This threshold value has been found to provide a very high quality of the resulting monosilicon structure. Preferably, the substrate is cleaned by immersion in a solution of hydrofluoric acid (followed by rinsing and drying). This procedure is simple, but at the same time particularly effective.

Preferably, the deposition of the silicon layer is carried out at a temperature between 600° C. and 650° C. This range of temperature ensures that the procedure does not affect the diffusion profiles inside the substrate. Alternatively, the substrate is prepared in a different manner, the surface oxide has a different thickness, the substrate is cleaned by use of a hydrofluoric acid vapor or a plasma process, or the silicon layer is deposited at a different temperature.

In a preferred embodiment of the present invention, the monosilicon portion is grown by heating the substrate at a temperature between 800° C. and 1100° C. Moreover, the heating step lasts for a period ranging from 10 s to 30 s. These parameters provide the best performance of the method of the present invention. Advantageously, the heating procedure is carried out with a rapid thermal annealing technique. The chosen technique minimizes the diffusion of impurities from the silicon layer into the substrate. However, the method according to the present invention lends itself to be carried out using different parameters or techniques for the heating procedure, such as placing the substrate into a furnace at about 900° C. for a few minutes.

Preferably, the method of the present invention is used to manufacture a bipolar transistor. The absence of prolonged high temperature treatments after the base region formation results in a transistor with an ultra shallow structure, particularly suitable for high-speed applications. Moreover, the reduced recombination of minority charges during operation of the transistor increases its gain and noise performance. The absence of any relevant dopant segregation from the substrate to the emitter region further enhances the performance of the transistor. The interface-free structure obtained by the method of the present invention strongly reduces the electrical resistance of the emitter region, and increases the maximum current rating of the transistor.

The above-mentioned advantages are all the more important in a heterojunction bipolar transistor. In fact, the method according to the present invention prevents any movement of the germanium and the generation of crystal dislocations within the base region. However, the solution of the present invention also leads itself to be used in different applications. For example, the present invention leads itself to be used to manufacture conventional homojunction bipolar transistors, detectors, high-speed diodes, and the like.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for forming an interface free layer of silicon on a substrate of monocrystalline silicon, the method comprising:

providing a substrate of monocrystalline silicon having a surface substantially free of oxide;

depositing a silicon layer in-situ doped on the surface of the substrate in an oxygen-free environment and at a temperature below 700° C. so as to produce a monocrystalline portion of the silicon layer adjacent to the substrate and a polycrystalline portion of the silicon layer spaced apart from the substrate; and heating the silicon layer so as to grow the monocrystalline portion of the silicon layer through a part of the polycrystalline portion of the silicon layer.

2. The method of claim 1, wherein in the providing step, the substrate of monocrystalline silicon has a surface on which is formed a layer of oxide with a thickness of less than 1 nm.

3. The method of claim 2, wherein the providing step comprises the sub-steps of:

immersing the substrate in a solution of hydrofluoric acid;

rinsing the substrate; and drying the substrate.

4. The method of claim 1, wherein the providing step comprises the sub-steps of:

immersing the substrate in a solution of hydrofluoric acid;

rinsing the substrate; and drying the substrate.

5. The method of claim 1, wherein in the depositing step, the silicon layer is deposited at a temperature between 600° C. and 650° C.

6. The method of claim 5, wherein in the heating step, the silicon layer is heated to a temperature between 800° C. and 1100° C.

7. The method of claim 6, wherein in the heating step, the silicon layer is heated for from 10 s to 30 s.

8. The method of claim 1, wherein in the heating step, the silicon layer is heated to a temperature between 800° C. and 1100° C.

9. The method of claim 1, wherein in the heating step, the silicon layer is heated for from 10 s to 30 s.

10. The method of claim 1, wherein the heating step is carried out with a rapid thermal annealing technique.

11. A method for forming an interface free layer of silicon on a substrate of monocrystalline silicon, the method comprising:

providing a substrate of monocrystalline silicon having a surface substantially free of oxide;

depositing a silicon layer on the surface of the substrate in an oxygen-free environment so as to produce a monocrystalline portion of the silicon layer adjacent to the substrate and a polycrystalline portion of the silicon layer spaced apart from the substrate; and heating the silicon layer so as to grow the monocrystalline portion of the silicon layer through a part of the polycrystalline portion of the silicon layer.

12. The method of claim 11, wherein in the depositing step, the silicon layer that is deposited is in-situ doped.

13. The method of claim 11, wherein in the depositing step, the silicon layer is deposited at a temperature below 700° C.

14. The method of claim 11, wherein in the providing step, the substrate of monocrystalline silicon has a surface on which is formed a layer of oxide with a thickness of less than 1 nm.

15. The method of claim 11, wherein in the providing step, the substrate includes a collector region of a first conductivity type and a base region of a second conductivity type, and in the heating step, the monocrystalline portion of the silicon layer defines an emitter region and the polycrystalline portion defines a contact region for the emitter region.

* * * * *